US011171168B2

(12) United States Patent
Delga et al.

(10) Patent No.: US 11,171,168 B2
(45) Date of Patent: Nov. 9, 2021

(54) BI-SPECTRAL DETECTOR

(71) Applicants: THALES, Courbevoie (FR); COMMISSARIAT A L'ENERGIE ATOMIQUE ET AUX ENERGIES ALTERNATIVES, Paris (FR)

(72) Inventors: Alexandre Delga, Palaiseu (FR); Jean-Luc Reverchon, Palaiseu (FR)

(73) Assignees: THALES, Courbevoie (FR); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/258,089

(22) PCT Filed: Jun. 21, 2019

(86) PCT No.: PCT/EP2019/066468
§ 371 (c)(1),
(2) Date: Jan. 5, 2021

(87) PCT Pub. No.: WO2020/007622
PCT Pub. Date: Jan. 9, 2020

(65) Prior Publication Data
US 2021/0288095 A1    Sep. 16, 2021

(30) Foreign Application Priority Data
Jul. 5, 2018  (FR) ..................... 18/00717

(51) Int. Cl.
*H01L 27/146* (2006.01)
*H01L 27/14* (2006.01)

(52) U.S. Cl.
CPC .... *H01L 27/14625* (2013.01); *H01L 27/1465* (2013.01); *H01L 27/14652* (2013.01)

(58) Field of Classification Search
CPC .......... H01L 27/14625; H01L 27/1465; H01L 27/14652
See application file for complete search history.

(56) References Cited

U.S. PATENT DOCUMENTS

| | | | |
|---|---|---|---|
| 6,420,728 B1 * | 7/2002 | Razeghi | B82Y 20/00 257/14 |
| 7,936,034 B2 * | 5/2011 | Rothman | H01L 27/144 257/438 |
| 2016/0322516 A1 | 11/2016 | Portier et al. | |

FOREIGN PATENT DOCUMENTS

| | | |
|---|---|---|
| EP | 2180511 A2 | 4/2010 |
| WO | 2020007622 A1 | 1/2020 |

OTHER PUBLICATIONS

Foreign Communication from a Related Counterpart Application, International Search Report and Written Opinion dated Sep. 10, 2019, International Application No. PCT/EP2019/066468 filed on Jun. 21, 2019.

(Continued)

*Primary Examiner* — Seung C Sohn

(57) ABSTRACT

An optical detector that is sensitive in at least two infrared wavelength ranges: first spectral band and second spectral band; and having a set of pixels, comprising: an absorbent structure disposed on a lower face of a substrate and comprising a stack of at least one absorbent layer made of semi-conductor material; the detector further comprising a plurality of dielectric resonators on the upper surface of said substrate forming an upper surface metasurface, the metasurface configured to diffuse, deflect and focus in the pixels of the detector in a resonant manner, when illuminated by the incident light, a first beam having at least one first wavelength included in the first spectral band and a second beam having at least one second wavelength included in the second band, the metasurface also being configured so that (Continued)

said first and second beams are focused on different pixels of the detector.

15 Claims, 11 Drawing Sheets

(56) References Cited

OTHER PUBLICATIONS

A Rogalski, "Infrared detectors: an overview", Infrared Physics & Technology, vol. 43, No. 3-5, Jun. 1, 2002, pp. 187-210 XP055007585 ISSN 1350-4495, DOI: 10.1016/S1350-4495(02)00140-8 p. 17-19, figures 22-24.

* cited by examiner

BI-SPECTRAL DETECTOR

CROSS-REFERENCE TO RELATED APPLICATIONS

The present application is a filing under 35 U.S.C. 371 as the National Stage of International Application No. PCT/EP2019/066468, filed Jun. 21, 2019, entitled "IMPROVED BI-SPECTRAL DETECTOR," which claims priority to French Application No. 18/00717 filed with the Intellectual Property Office of France on Jul. 5, 2018 and entitled "IMPROVED BI-SPECTRAL DETECTOR," both of which are incorporated herein by reference in their entirety for all purposes.

FIELD OF THE INVENTION

The invention relates to an enhanced bi-spectral detector, for the infrared IR imaging ranges. More particularly, the invention relates to a bi-spectral detector, that is to say one that is sensitive in two IR spectral bands, for example in the MWIR (Medium Wavelength Infra-Red) band, typically lying between 3 µm and 5 µm, and in the LWIR (Long Wavelength Infra-Red) band typically lying between 8 µm and 12 µm.

STATE OF THE ART

In thermal infrared imaging, two wavelength ranges are mainly distinguished that benefit from atmospheric transmission:

medium infrared or MWIR from 3 to 5 µm, which is itself subdivided into two windows on either side of the $CO_2$ absorption band. The emission of the black body varies strongly with temperature and the transmission is less disturbed by the moisture.

the far infrared or LWIR from 8 to 12 µm. It corresponds to an emission peak from a black body at ambient temperature. It is insensitive to light diffusion phenomena. Each of its two windows therefore offers advantages according to the operational conditions (maritime zone, coastal zone, desert zone etc.) beyond the intrinsic qualities of the imagers that allow these two wavelength ranges to be addressed (uniformity, detectivity, etc.).

Also, an offering based on an MWIR/LWIR bi-spectral camera was proposed in the 2000s.

According to a first technology, called Bayer matrix, the detector comprises a semiconductive layer that is absorbent simultaneously in the two IR bands, and interferential filters are disposed on the pixels to detect an LWIR image $Im_L$ and an MWIR image $Im_M$. Producing these filters is complex, the sensitivity and the resolution are low, and the two images $Im_L$ and $Im_M$ recovered by the detector do not exhibit spatial coherence.

Spatial coherence between the two images is understood to mean the fact that the incident light on one and the same pixel of each image originates from the same zone of the scene. Since the LWIR and MWIR pixels are, here, adjacent, there cannot be spatial coherence between the two images.

The detection of two coherent images offers the benefit of being able to accurately compare the MWIR and LWIR signature of an element of the scene which sometimes extends only over a few pixels.

A second technology allowing the spatial coherence to be retained is based on a detector comprising two superposed absorbent layers, one sensitive in the LWIR and one sensitive in the MWIR, as illustrated in FIG. 1.

In this example, each stage consists of a QWIP ("Quantum Well Infrared Photodetector") based on GaAs/AlGaAs. The pixel has a mesa structure corresponding to an etching of the active layers to delimit the pixel, the latter then being in contact with the air. This type of structure requires a contact per layer ($C_{LWIR}$ and $C_{MWIR}$) and a common contact CC to be made. Preferentially, these three contacts are mounted on the same plane, to facilitate the connection to the read-out circuit.

The QWIP technology is a technology of inter-subband (ISB) type in which the photo-carriers are generated from one subband of the conduction band to another subband of the conduction band.

The main problems encountered are a poor optical coupling of the MWIR stage compromising the critical quantum efficiency in the MWIR range. Issues of optical cross talk through the common contact have complicated production.

Generally, the implementation of two contacts is difficult at the matrix level for these two-stage structures.

For a mesa pixel, the contact between the active layer and the air creates a dark current, this being particularly critical for the detectors based on inter-band detection, that is to say generation of photo-carriers from the valency band to the conduction band. An example that can be cited is a type II super-gratings sensor on GaSb having a mesa structure on at least one level. For the detectors based on inter-band detection, it is therefore best to passivate the mesa structure, which poses technological problems.

Thus, none of the approaches for IR bi-spectral imaging according to the state of the art has truly succeeded in standing out for reasons of complexity of the optic and of the detector.

One aim of the present invention is to mitigate some of the abovementioned drawbacks by proposing an enhanced bi-spectral detector having a simplified technology, a better resolution and/or FTM (modulation transfer function), and/or a better gain and/or a better sensitivity.

DESCRIPTION OF THE INVENTION

The subject of the present invention is an optical detector sensitive in at least two infrared wavelength ranges called first spectral band and second spectral band, and having a set of pixels, comprising:

an absorbent structure disposed on a bottom face of a substrate and comprising a stack of at least one absorbent layer made of semiconductor material, sensitive in the two spectral bands and capable of photo-generating carriers by absorption of an incident beam on a top face of said substrate, the absorbent structure being also linked to a read-out circuit by at least one set of contacts associated with said pixels, the detector further comprising a plurality of dielectric resonators on the top face of said substrate forming a top surface called meta-surface, the meta-surface being configured to diffuse, deflect and focus in the pixels of the detector in a resonant manner, when lit by the incident light, a first beam having at least one first wavelength lying in the first spectral band and a second beam having at least one second wavelength lying in the second band, the meta-surface being also configured so that said first and second beams are focused on different pixels of the detector.

Advantageously, the first spectral band lies within the 3-5 µm band and the second spectral band lies within the 8-12 µm band.

According to a first variant, the stack comprises a single absorbent layer sensitive both in the first spectral band and the second spectral band, the first beam being focused on a first subset of pixels called first pixels, and the second beam being focused on a second subset of pixels called second pixels, said first and second pixels being disposed in the same plane.

According to a second variant, the stack comprises a first absorbent layer sensitive in the first spectral band and disposed in a first plane, and a second absorbent layer sensitive in the second spectral band and disposed in a second plane different from the first plane, the first absorbent layer being the closest to the substrate, the first beam being focused substantially in the first plane on a first subset of pixels called first pixels, and the second beam being focused substantially in the second plane on a second subset of pixels called second pixels.

According to one embodiment, the second absorbent layer is discontinuous and etched so that a second pixel has a mesa structure. Preferentially, the second absorbent layer produces an inter-subband detection.

According to one embodiment, a second pixel comprises a diffraction grating configured to diffract the second beam in reflection mode.

According to a subvariant, the first absorbent layer is continuous.

Advantageously, the first absorbent layer (AL1) produces an inter-band detection.

According to one embodiment, each first pixel (Pix1) is linked to a first contact and each second pixel is linked to a second contact, and a mesa structure of a second pixel in every two is used as pillar so as to bring the first contacts to substantially the same horizontal plane as the second contacts.

According to one embodiment, each first pixel is linked to a first contact and each second pixel is linked to a second contact, and the first absorbent layer is discontinuous and etched so that each first pixel has a mesa structure serving as base for the mesa structure of the second pixel.

According to one embodiment, a mesa structure of a second pixel in every two is used as pillar (15) so as to bring the first contact (CL1) to substantially the same horizontal plane as the second contact (CL2).

According to one embodiment, a first meta-lens is defined as the fraction of the meta-surface focusing the first beam in a first associated pixel, and a second meta-lens is defined as the fraction of the meta-surface focusing the second beam in a second associated pixel, and wherein the meta-surface is configured so that the first and second meta-lenses are offset with respect to one another.

According to another embodiment, a first meta-lens is defined as the fraction of the meta-surface focusing the first beam in a first associated pixel, and a second meta-lens is defined as the fraction of the meta-surface focusing the second beam in a second associated pixel, and wherein the meta-surface is configured so that the first and second meta-lenses are superposed.

Preferentially, the sum of the respective surfaces of a first pixel and of a second pixel is less than or equal to the surface of a meta-lens.

Other features, aims and advantages of the present invention will become apparent on reading the following detailed description and in light of the attached drawings given as nonlimiting examples and in which:

BRIEF DESCRIPTION OF DRAWINGS

FIG. 3a illustrates a resonator of round form and FIG. 3b illustrates a resonator of square form.

DETAILED DESCRIPTION OF THE INVENTION

The invention relates to an optical detector 10 sensitive in at least two infra-red wavelength ranges called first spectral band SB1 and second spectral band SB2, commonly called bi-spectral detector.

According to a preferred embodiment, the first spectral band SB1 lies within the 3-5 μm MWIR band and the second spectral band SB2 lies within the 8-12 μm LWIR band.

And other bi-spectral configurations are possible, such as:

"blue" MWIR around 4.2 μm and "red" MWIR around 4.8 μm, that is to say on either side of the $CO_2$ absorption band (to facilitate the detection of hot spots for example), LWIR [8-10 μm] and LWIR [10-12 μm], MWIR and near infrared (called SWIR).

The bi-spectral detector according to the invention comprises a set of pixels, preferably arranged in matrix form, subdivided into a first subset of pixels called first pixels Pix1 configured to detect a light signal in SB1, and a second subset of pixels called second pixels Pix2 configured to detect a light signal in SB2.

Different variants of the detector 10 according to the invention are illustrated in FIGS. 2, 5, 7, 8, 9 and 11 which will be described separately later.

It comprises an absorbent structure Sabs disposed on a bottom face 11 of a substrate Sub comprising a stack of at least one absorbent layer made of semiconductor material, also called active layer, the stack being sensitive in the two spectral bands SB1, SB2 and capable of photo-generating carriers by absorption of an incident light beam IL on a top face 12 of the substrate Sub. Typically, the thickness of the substrate is between a few tens and a few hundreds of μm and the substrate material is chosen from among: InP, GaAs, GaSb, Si, SiC, diamond.

The absorbent structure typically comprises, in addition to the active layer or layers, several other layers (not represented), such as carrier injection layers.

An active layer can consist of a large number of sublayers, such as multi-quantum wells or superlattices. Examples of semiconductor material for the absorbent layer are: InGaAs; InAsSb; InAsSb/InAs superlattice; InSb; GaSb/InAs superlattice; GaN; AlGaN, AlGaAsSb; GaAs/AlGaAs or InGaAs/AlInAs multi-quantum wells, InAs/AlSb superlattice.

Figure 2:
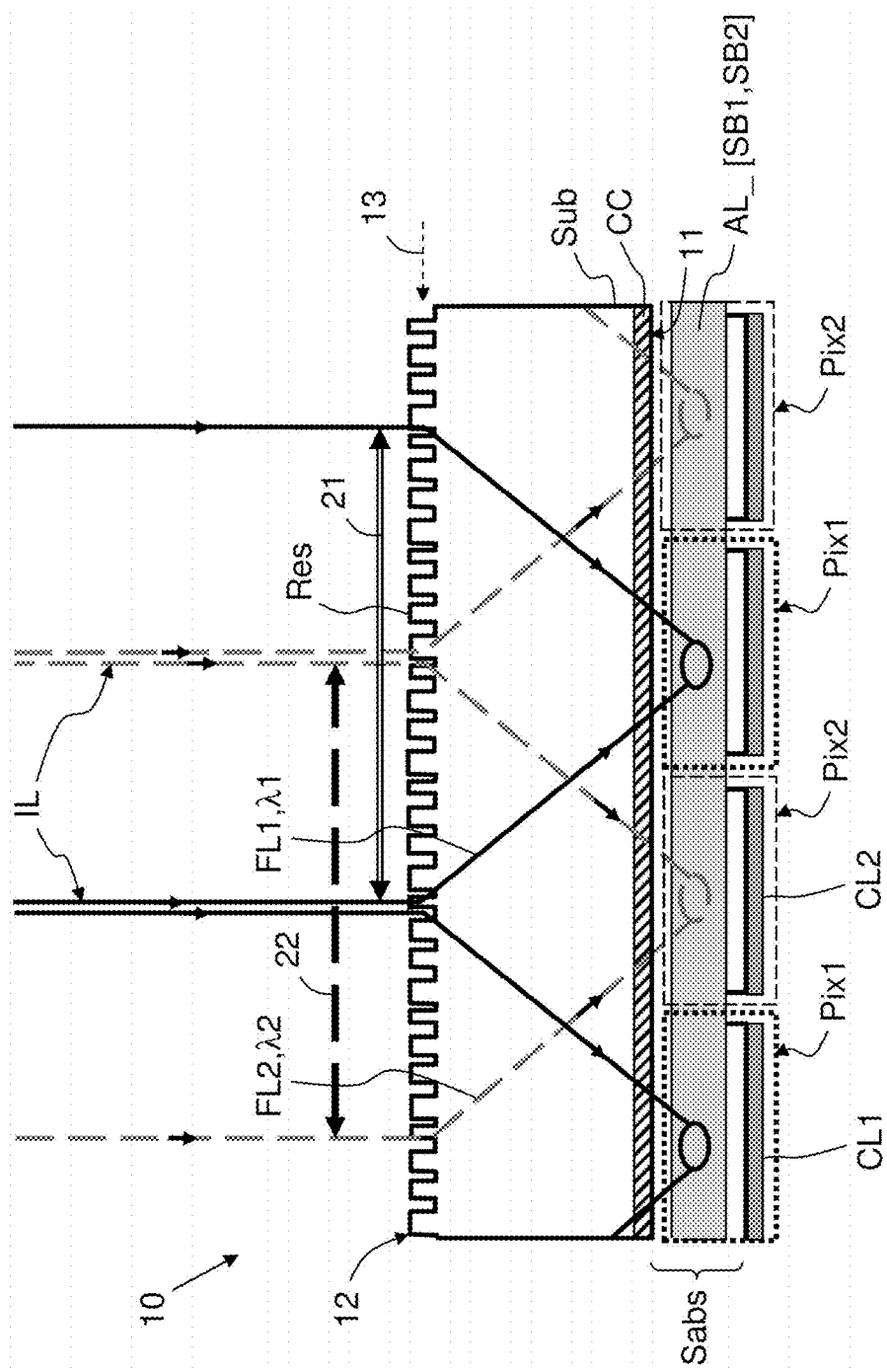
FIG. 2 illustrates a first variant detector according to the invention with a single level combined with a staggered mode arrangement of the meta-lenses.
Figure 5:
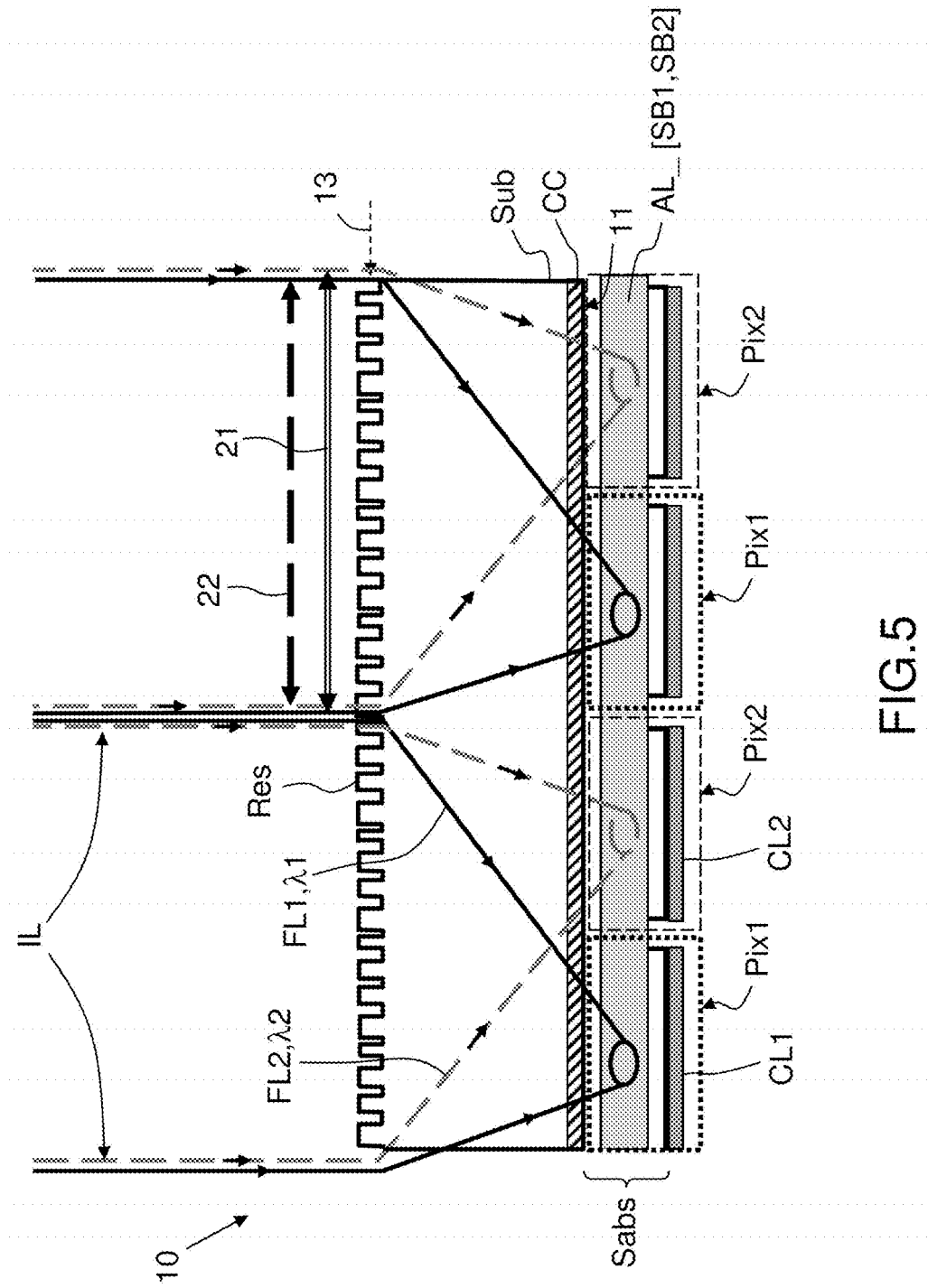
FIG. 5 illustrates a first variant detector according to the invention with a single level combined with a superposed-mode arrangement of the meta-lenses.

In a first variant illustrated in FIGS. 2 and 5, the stack comprises a single absorbent layer AL sensitive both in the first spectral band SB1 and the second spectral band SB2.

In a second variant illustrated in FIGS. 7, 8, 9 and 11, the stack comprises a first absorbent layer AL1 sensitive in the first spectral band SB1 disposed in a first plane PL1, and a second absorbent layer AL2 sensitive in the second spectral band SB2 disposed in a second plane PL2 different from the first plane. The two planes PL1 and PL2 are superposed. By convention, the first absorbent layer AL1 is the closest to the substrate.

The absorbent structure is also linked to a read-out circuit (not represented in the figures) via at least one set of contacts associated with the pixels, and there is also a contact common to all the pixels CC, for example consisting of a highly doped zone at the end of the substrate situated on the side of the absorbent layer AL or AL1.

The detector according to the invention further comprises a set of dielectric resonators Res on the top face 12 of the substrate Sub forming a top surface called meta-surface 13.

When it is lit by the incident beam IL, the meta-surface 13 is configured to diffuse in a resonant manner and focus in the pixels of the detector, a first light beam FL1 having at least one first wavelength $\lambda 1$ lying within the first spectral band SB1 and a second light beam FL2 having at least one second wavelength $\lambda 2$ lying within the second spectral band SB2.

The meta-surface is also configured so that the first beam FL1 and the second beam FL2 are focused on different pixels of the detector, it spatially splits the two wavelengths $\lambda 1$, $\lambda 2$.

The first beam FL1 is focused on a first subset of pixels consisting of first pixels Pix1, and the second beam FL2 is focused on a second subset of pixels consisting of second pixels Pix2. The meta-surface 13 therefore allows the incident flux to be focused on the desired pixels.

For the first variant of the detector according to the invention illustrated in FIGS. 2 and 5, the first and second pixels are disposed in the same plane, the detector has only a single level. The spectral selectivity works by "photon sorting" by means of the meta-surface.

Contacts CL1 associated with the pixels Pix1 and contacts CL2 associated with the pixels Pix2 are defined.

The read-out circuit reconstructs, from the incident beam IL originating from a scene, an image Im1 in SB1 originating from the pixels Pix1, and an image Im2 in SB2 originating from the pixels Pix2, from electrical signals derived from the photo-carriers arriving respectively on the contacts CL1 and CL2.

For the first variant, the layer AL being sensitive in the two spectral bands, it is the meta-surface 13 which determines the pixels Pix1 which detect the image Im1 and the pixels Pix2 which detect the image Im2.

The resonators Res of the meta-surface 13 are either etched directly in the substrate Sub (in this case they do not exhibit any difference of index with the substrate) or produced on another surface added onto the substrate.

Generally, this set of resonators forms a Huygens meta-surface which acts on the incident light so as to perform one or more optical functions. These elements constitute a monolayer of dielectric nano-antennas which operate in resonant mode, intensifying the response in the vicinity of resonance frequency $\lambda_R$ (spectral width of the resonance centered on $\lambda_R$) while cutting the light flow around this resonance spectral width. Each resonator is a radiating dipole or Huygens dipole and a significant number of antenna modes are accessible by acting on the form, the size and the arrangement of these dipoles. They make up an assembly of nano-antennas whose dimensions and spacing are of the order of magnitude of the resonance wavelength, or sub-wavelength. Each resonator imparts a specific phase on the incident signal, a phase controlled both in SB1 and SB2.

More generally, each nano-antenna can be seen as a local surface impedance value at the two wavelengths $\lambda 1$ and $\lambda 2$.

The resonators act as convergent microlenses allowing the incident light to be focused in a spectral band around the resonance wavelength, as close as possible to the contact of the pixel. The effective profile of the lens is controlled by the disposition of the antennas.

Compared to the optical structures of effective index type (digitized Fresnel lens type), the physical principle differs: the wave front is modeled, because of a phase conferred abruptly, over a very short distance ahead of the wavelength, and not accumulated along the optical path. A photon incident on a point of the microlens is picked up by a specific nano-antenna, interacts with it and is re-transmitted with a given phase. The accessible lens profiles are more varied than for the structures with effective index and the focal length of the lens, which can be very short, is controlled very precisely.

The meta-surface of the invention is configured to resonate simultaneously at $\lambda 1$ and $\lambda 2$ (with, respectively, a spectral width around these two wavelengths). The capacity of the same meta-surface to focus, that is to say resonate simultaneously on several wavelengths, has been demonstrated for telecoms wavelengths, with cofocusing of 3 wavelengths in the publication by Aieta et al: "Multiwavelength achromatic metasurfaces by dispersive phase compensation" Science, 347 (6228), 1342-1345 (2015). The focusing is performed by means of an assembly of hybrid resonators formed by several coupled sub-resonators. Thus, the engineering of the coupling allows the desired impedance profile to be obtained with several resonance wavelengths.

The dimensions of the resonators are smaller than the dimensions of the pixels of the detector. The term first meta-lens ML1 designates the fraction of the meta-surface 13 focusing the first beam FL1 in a first associated pixel Pix1 and the term second meta-lens ML2 designates the fraction of the meta-surface focusing the second beam FL2 in a second associated pixel Pix2.

For example, in FIGS. 2 and 5, the arrows 21 and 22 respectively illustrate the dimension of the pupil of ML1 and of ML2. Each meta-lens consists of a plurality of resonators, typically at least 5×5 resonators.

Typically, at least one dimension of a resonator Res, chosen from among width, length, height, lies within the range [$\lambda_R$/2n−50%; $\lambda_R$/2n+50%] or within the range [$\lambda_R$/n−50%; $\lambda_R$/n+50%], with:

$\lambda_R$ resonance wavelength=λ1 or λ2, n the index of the material in which the resonators are etched.

Figure 3:
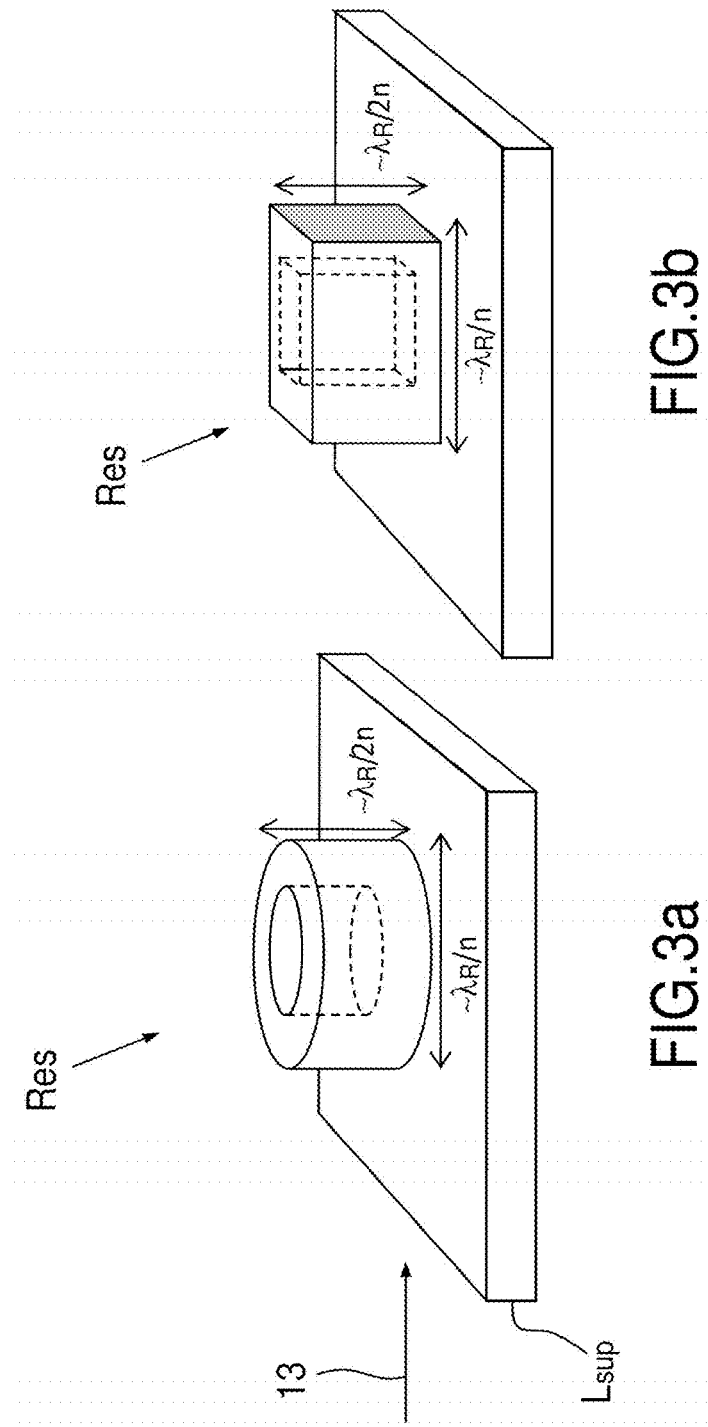
FIG. 3 illustrates examples of forms of resonators according to the invention.

FIG. 3 illustrates two examples of basic pattern of resonators Res according to the invention. Typically, they have a circular (FIG. 3a) or rectangular (FIG. 3b) form. They can be in the form of walls, the center being hollow, or being solid.

Depending on the desired optical function, sub-patterns can be etched in the basic pattern forming the resonator, such as the holes at the center of the structures of FIGS. 3a and 3b, constituting sub-patterns.

By virtue of the meta-surface, the optical and electrical cross talk phenomena are drastically limited, the sensitivity of the sensor is increased or it is possible to reduce the size of the pixels while maintaining an acceptable sensitivity. Furthermore, the use of resonators according to the invention allows the microlenses to be produced with a simple technology in a single step, and in which the patterns are wider than those needed for the digitized Fresnel lenses.

For the first variant illustrated in FIGS. 2 and 5, by virtue of the meta-surface according to the invention, the dielectric filters are eliminated, which greatly simplifies the detector fabrication method. Furthermore, the detector thus produced has only a single contact level, hence greatly simplified fabrication.

For the absorbent layer AL sensitive in SB1 and SB2, with SB1 lying in MWIR and SB2 lying in LWIR, according to one option, a semiconductor material is used with a "gap" in the LWIR, while ensuring that the substrate absorbs neither in the LWIR nor in the MWIR. It is made thinner if necessary. The sensitivity of the detecting layer AL covers SB1-SB2 and the range between the two (so-called wideband layer AL). For example, it is produced in MCT or with a superlattice.

According to another option, the sensitivity of the layer is bi-spectral, obtained for example with a bi-spectral quantum cascade detector, called QCD, or with a hybrid QW/QCD structure. Here, the non-resonant, non-focused wavelengths pass through the layer without generating a background signal because they are not "seen" by the layer AL.

The meta-lenses ML1 form a first subset of meta-lenses constituting a first two-dimensional array, and the meta-lenses ML2 form a second subset constituting a second two-dimensional array of meta-lenses. The two arrays can be organized is between them in different ways.

According to an embodiment illustrated in FIG. 2, the meta-lenses ML1 and ML2 are organized according to a staggered mode.

Figure 4:
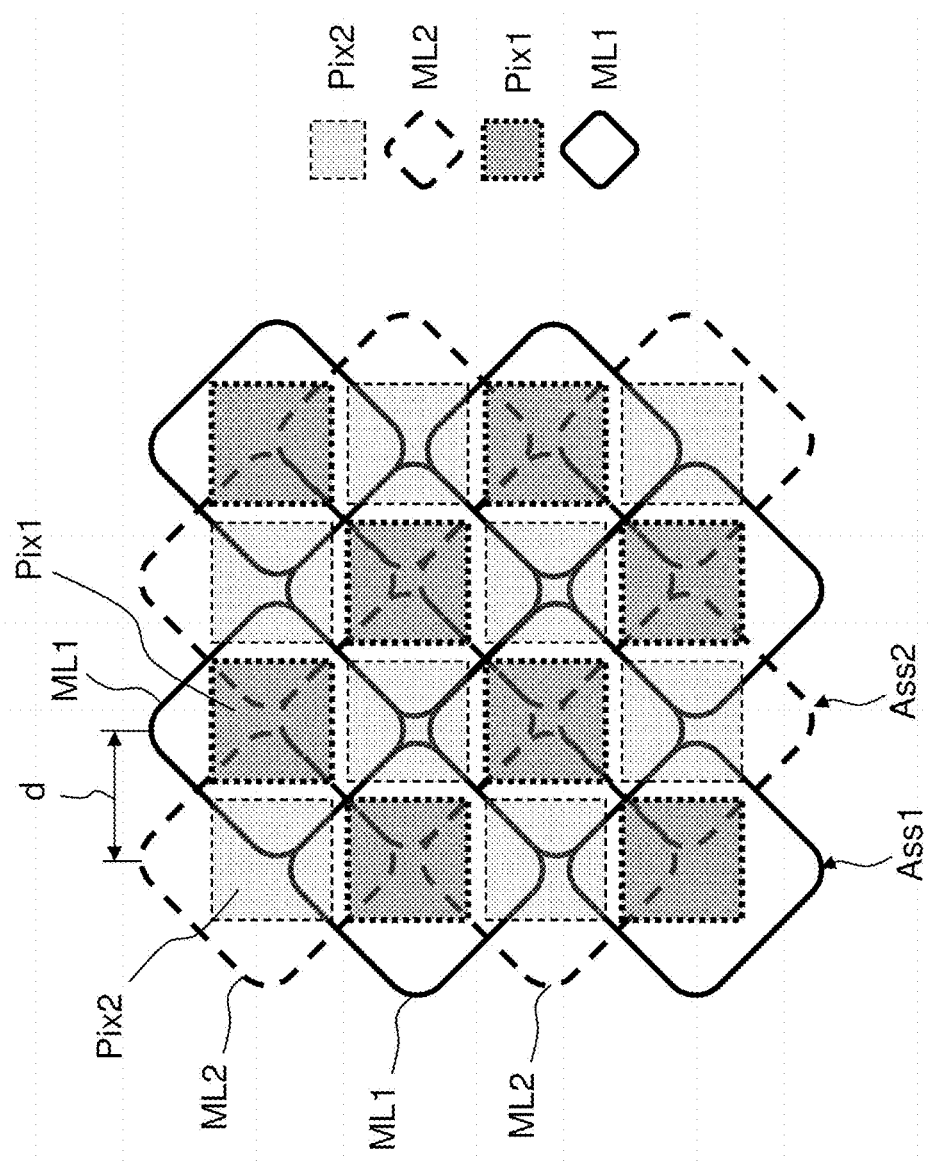
FIG. 4 illustrates an interleaved-type arrangement of meta-lenses applied to the first variant of the detector according to the invention, in plan view.

In plan view, an example of staggered (interleaved) arrangement suited to the first variant with a single level is illustrated in FIG. 4. In this example, the pixels are square, the meta-lenses have pupils that are substantially square and offset by 45° with respect to the squares forming the pixels, and the first and the second arrays of meta-lenses are offset according to a dimension of the square of the pixels by a distance d corresponding to the distance between two pixels in this same dimension. No incident flow is lost, and the loss of spatial resolution is halved compared to the "diluted" configurations described hereinbelow.

Figure 6:
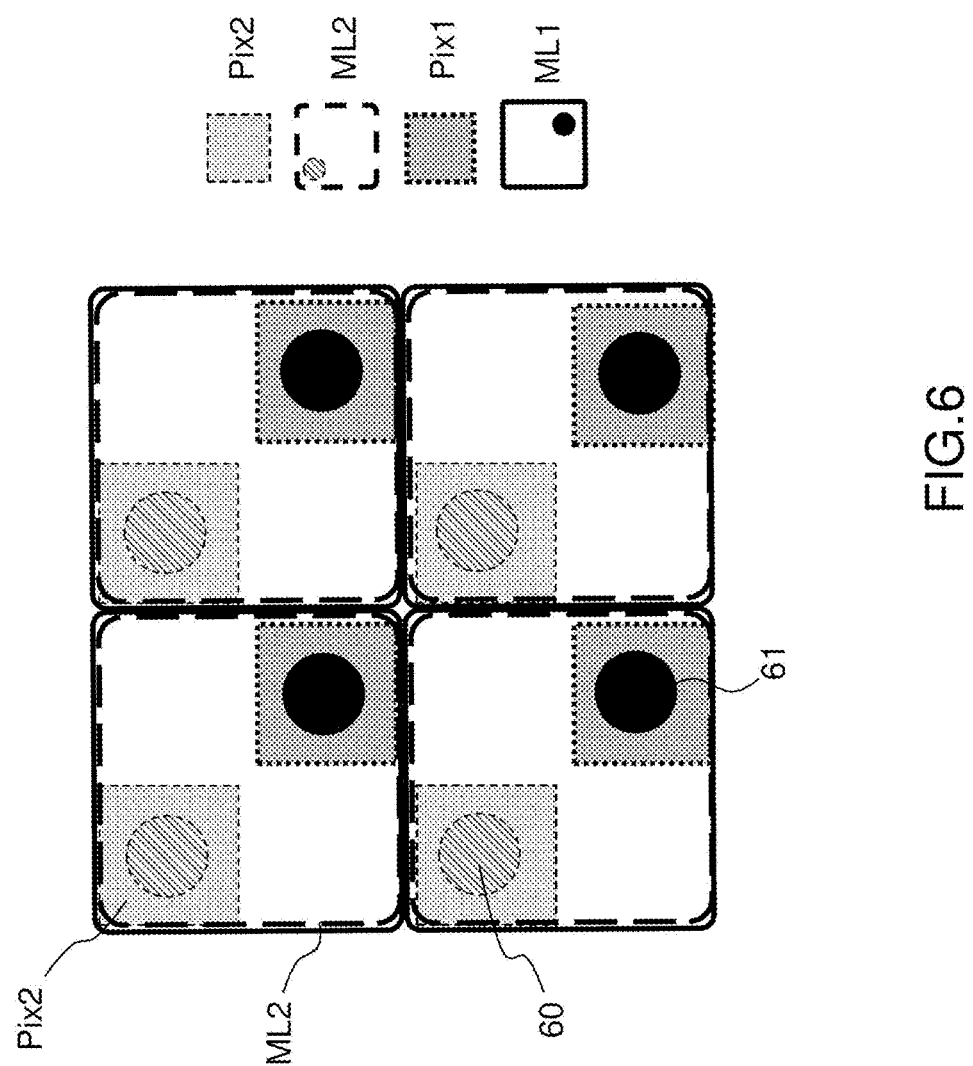
FIG. 6 illustrates a superposed-type arrangement of meta-lenses of the detector according to the invention, combined with a "diluted" type arrangement of the pixels, in plan view.

According to an embodiment illustrated in FIG. 5, the meta-surface is configured so that the first and second meta-surface are superposed. The meta-lenses ML1 and ML2 then operate off-axis and are nested in one another. In this case, the light reaching two pixels Pix1 and Pix2 that are adjacent and respectively associated with ML1 and ML2 superposed originate from the same point of the scene. There is then said to be spatial coherence between the two images Im1 and Im2 respectively detected by the first subset of first pixels and the second subset of second pixels. Spatial coherence between the two images im1 and Im2 allows the bi-spectral signature of very small zones in the scene to be detected. FIG. 6 illustrates an arrangement between pixels Pix1, Pix2 and meta-lenses ML1, ML2 compatible with a superposed arrangement of the meta-lenses. This arrangement is said to be "diluted" because the surface of the pixels is smaller than the surface of a meta-lens. The points 60 and 61 respectively schematically represent the focus of ML1 and of ML2.

Typically, the sum of the respective surfaces of a first pixel and of a second pixel is less than or equal to the surface of a meta-lens.

Producing a pixel with an "electrical" surface (detection surface) smaller than the "optical" surface (pupil) of the meta-lens offers the advantage of increasing the signal-to-noise ratio when the component is limited by dark noise: the signal corresponding to the optical surface, and the noise to the electrical surface.

According to the second variant of the detector according to the invention, the layers AU and AL2 are separate, superposed, and situated in two different planes PL1 and PL2 (vertical stacking). The sensitivity of AL1 and AL2 is then optimized for, respectively, SB1 and SB2.

The beam FL1 is focused substantially in PL1 on the first subset of pixels Pix1 and FL2 is focused substantially in PL2 on the second subset of pixels Pix2. The focal distances of the meta-lenses ML1 and ML2 are adjusted to focus in the associated layer and are therefore different. Each layer AL1, AL2 exhibits a sensitivity that is optimized independently of the other and is therefore more efficient than a wideband or bi-spectral layer AL. In this second variant, it is necessary to produce two contact levels.

Preferentially, the second absorbent layer AL2 is discontinuous and etched so that a second pixel Pix2 has a mesa structure, as illustrated in FIGS. 7, 8, 9 and 11, to allow the intermediate contact. For this type of structure, it is preferable for the second absorbent layer AL2 to perform an inter-subband detection, called ISB that is easy to passivate, for example of QWIP or QCD type.

According to one embodiment, each second pixel Pix2 comprises a diffraction grating DG2 configured to diffract the second beam FL2 in reflection mode. This grating is situated on the top of the mesa on the side opposite that by which the light flux arrives, or on the side of the read-out circuit (not represented in the figures). According to a known operation, these gratings are configured to diffract an evanescent wave which is absorbed by the layer AL2.

For SB2 corresponding to the LWIR, and for a detector on GaSb substrate, typically a layer AL2 in QCD form is preferred to QWIP because of a strong conduction band offset.

Figure 7:
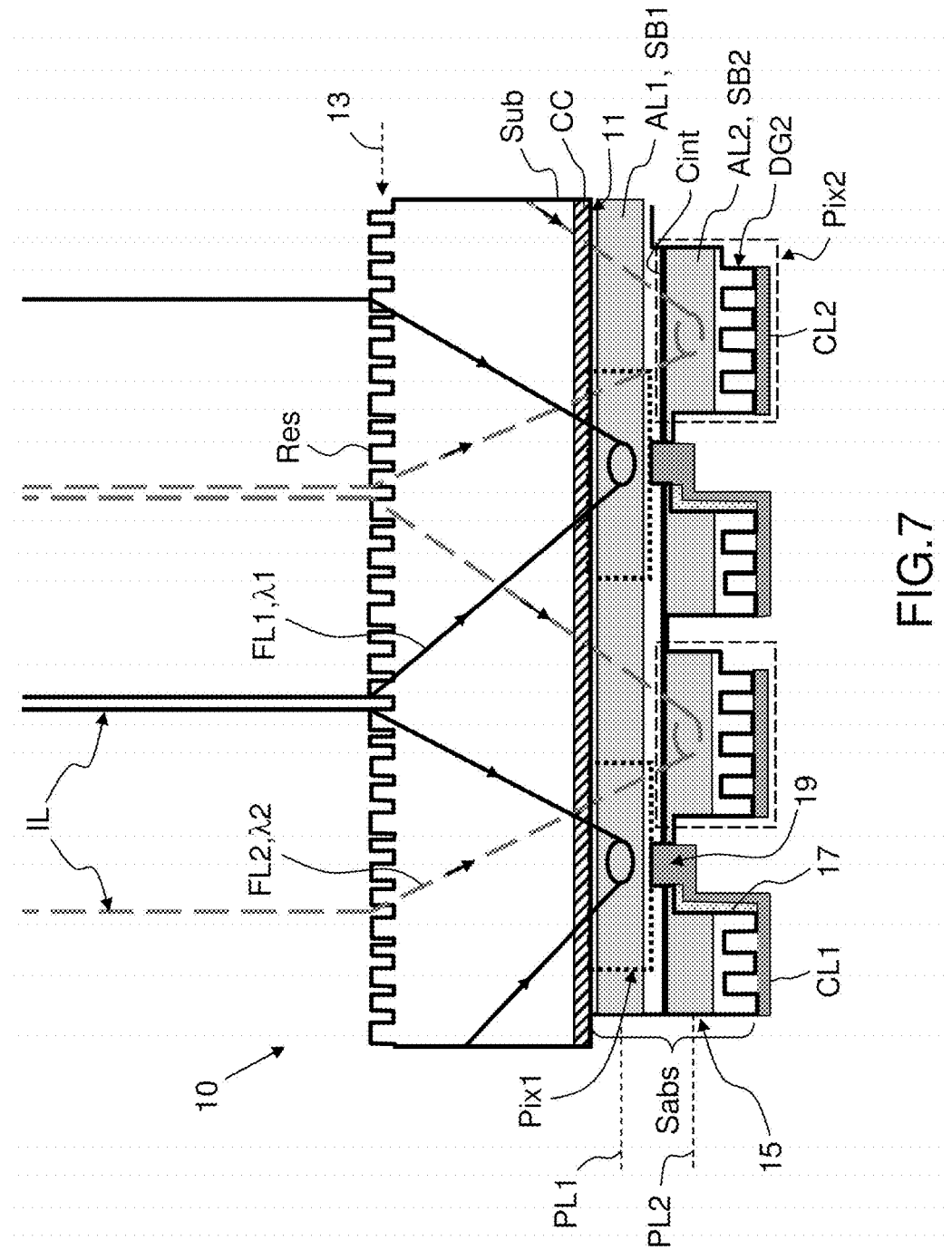
FIG. 7 illustrates the sub-variant with continuous first absorbent layer of a second variant detector according to the invention with two levels, combined with a staggered-type arrangement of the meta-lenses and having a simplified contact geometry, all the contacts being brought to the same plane.
Figure 8:
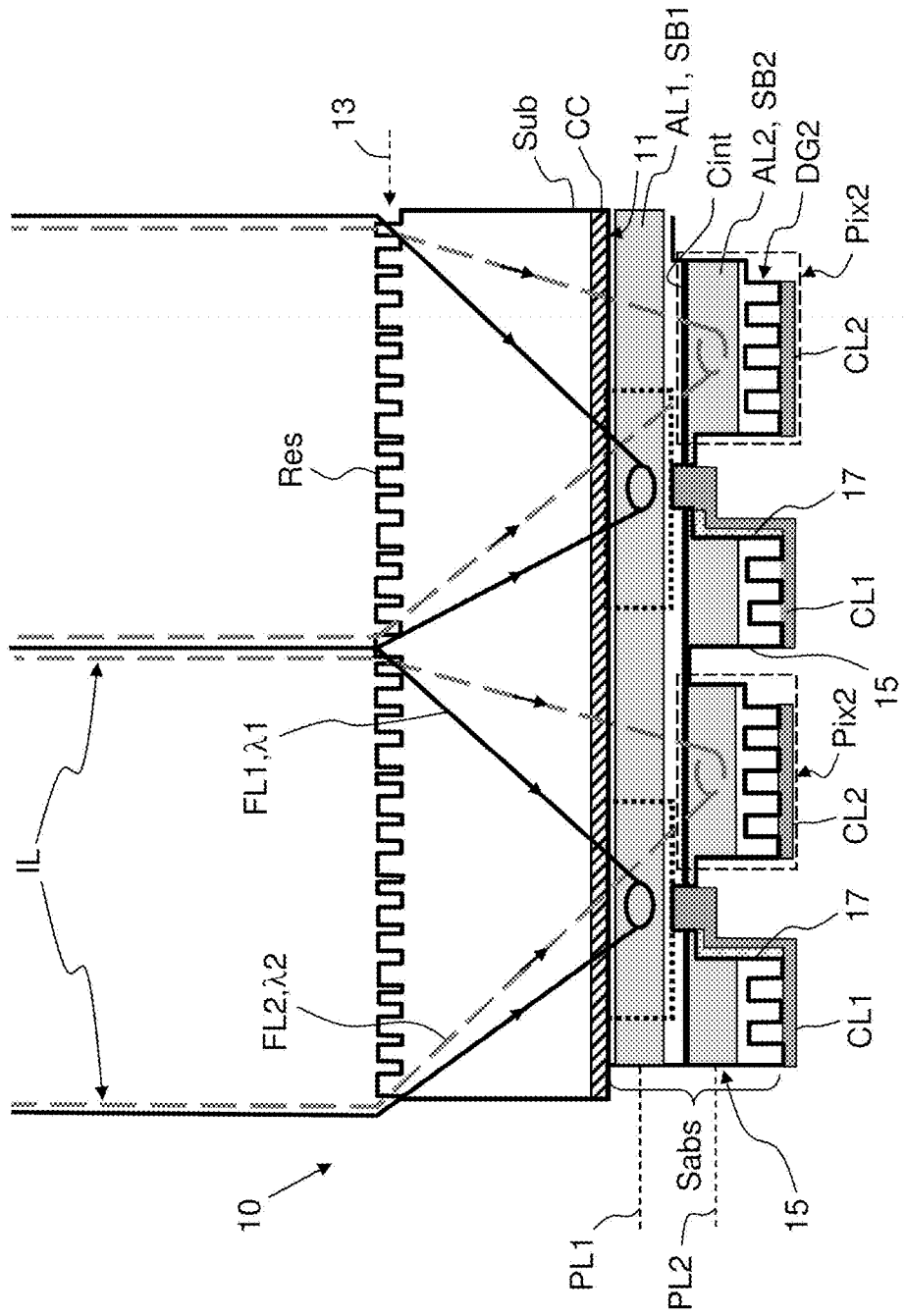
FIG. 8 illustrates the sub-variant with continuous first absorbent layer of the second variant detector according to the invention with two levels, combined with a superposed-type arrangement of the meta-lenses and having a simplified contact geometry, all the contacts being brought to the same plane.
Figure 9:
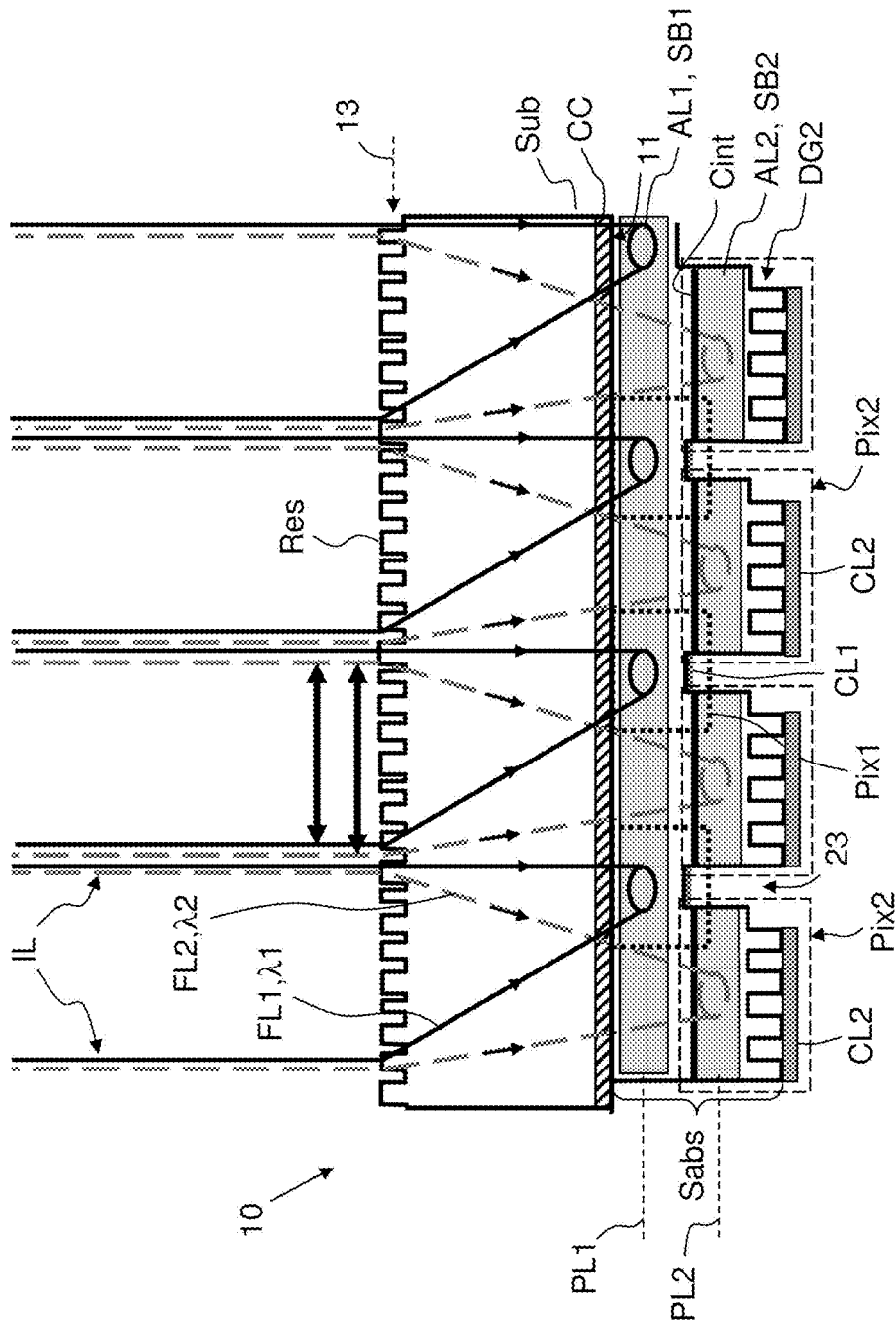
FIG. 9 illustrates the sub-variant with continuous first absorbent layer of the second variant detector according to the invention with two levels, combined with a superposed-type arrangement of the meta-lenses and having a "dense" type arrangement of the pixels.

According to a first sub-variant of the second variant, the first absorbent layer AL1 is continuous, as illustrated in FIGS. 7 to 9. The technology is then simplified and there is no need to choose a layer AL1 compatible with a mesa structure. Preferentially, the first absorbent layer AL1 produces an inter-band detection.

For SB1 corresponding to the MWIR, and a detector on GaSb substrate, typically a layer AL1 of planar InAsSb nBn type is preferred. It should be noted that this configuration can operate without meta-surface 13.

This type of continuous AL1/mesa AL2 architecture allows a simplified contact to be produced, as illustrated in FIGS. 7 and 8.

According to one embodiment, a mesa structure of a second pixel Pix2 in every two is used as pillar 15 on which there is deposited an insulating layer 17 then a contact CL1. The insulating layer 17 insulates the mesa on the contact CL1. This mesa structure 15 is not therefore used as detection pixel Pix2, it serves as support for a contact CL1. An intermediate contact Cint is produced between AL1 and AL2, and the contact CL1 is made with the layer AU through the intermediate contact Cint via a hole 19. The contact CL1 therefore extends from the summit of the mesa 15 to the hole 19 to the layer AL1.

The detection diode of a pixel Pix1 is therefore produced between the common contact CC and CL1, whereas the detection diode of a pixel Pix2 is produced between the intermediate contact Cint and CL2, the contact Cint serving as common contact for the pixels Pix2. Remember that each pixel of the matrix must have a common contact and an individual contact.

Thus, the first contacts CL1 are brought substantially to the same horizontal plane as the second contacts CL2, which greatly simplifies the connection of the s detection part of the detector to the read-out circuit (standard hybridization). This configuration of the contacts is made possible by the selective focusing produced by the meta-surface 13, without which the electrical signal would originate from too extensive an area, generating a prohibitive cross talk.

The first sub-variant is compatible with a staggered arrangement of the meta-lenses as illustrated in FIG. 7 and a superposed arrangement of the meta-lenses as illustrated in FIG. 8. In the latter configuration of FIG. 8, there is therefore spatial coherence between the two detected images, and an arrangement of "diluted" type of the pixels as illustrated in FIG. 6 is recommended.

Figure 1:
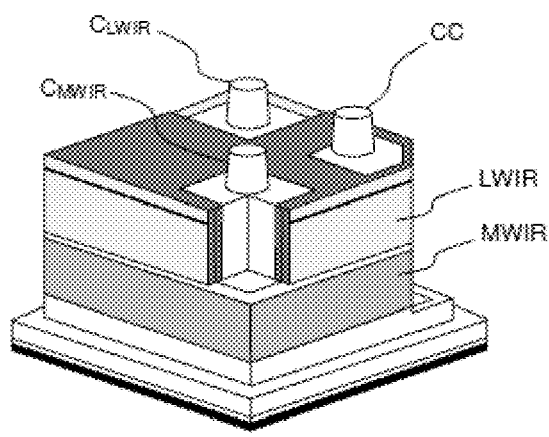
FIG. 1, already cited, illustrates a bi-spectral detector with mesa pixel according to the state of the art.

According to another embodiment of the first, continuous AL1/mesa AL2 sub-variant, all the mesas of Pix2 are used as detection pixels and covered with a contact CL2, as illustrated in FIG. 9. In this case, the contact CL1 remains located at the bottom of the inter-mesa space 23, and it would be necessary to seek this contact in the same way as is done for the detector of the state of the art illustrated in FIG. 1 (this raising of the contact is not represented).

This architecture does however have the advantage of exhibiting the highest spatial resolution of the different variants of the invention, while guaranteeing an enhanced FTM compared to the state of the art.

Figure 10:
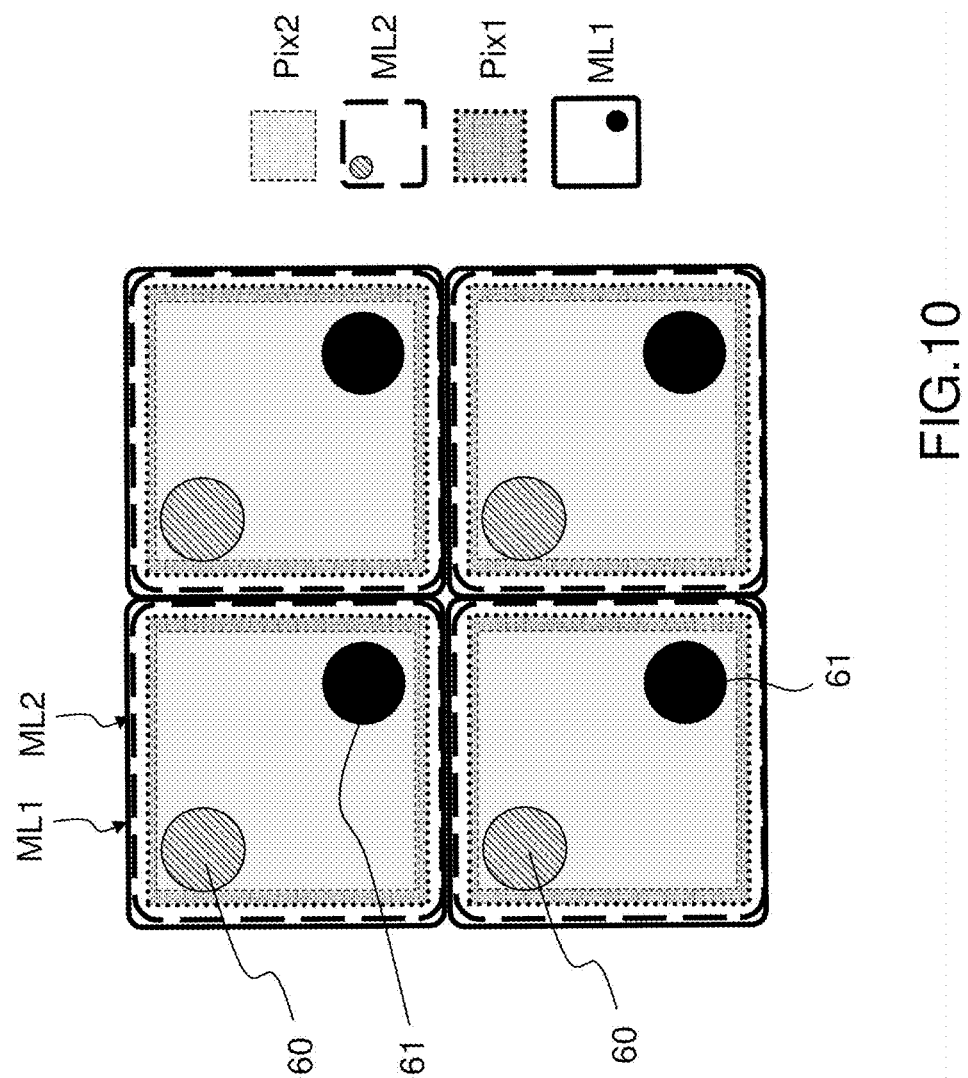
FIG. 10 illustrates a superposed-type arrangement of meta-lenses of the detector according to the invention, combined with a "dense" type arrangement of the pixels, in plan view.

This architecture combined with the superposed mode of the meta-lenses is compatible with a so-called dense architecture of the pixels illustrated in FIG. 10 in which the dimension of Pix1 and Pix2 is substantially equal to that of the meta-lenses, lenses and pixels being all superposed. More specifically, the points where the carriers are collected are offset between Pix1 and pix2, but the electrical contacts defining the electrical pixels are superposed.

Figure 11:
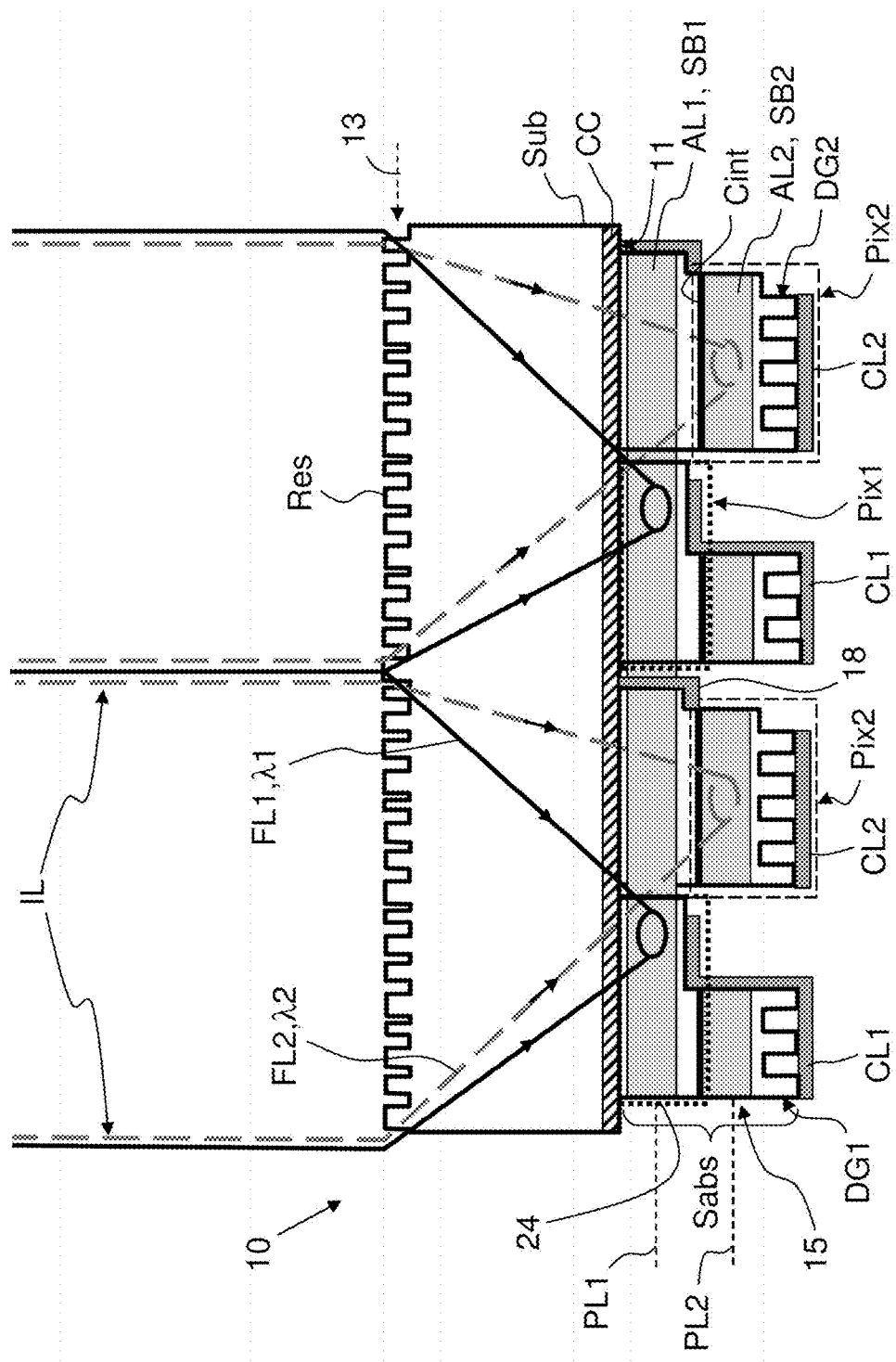
FIG. 11 illustrates the sub-variant with double mesa of the second variant detector according to the invention with two levels, combined with a superposed-type arrangement of the meta-lenses and having a "diluted" type arrangement of the pixels.

According to a second sub-variant of the second variant, the first absorbent layer AL1 is discontinuous and etched so that each first pixel Pix1 has a mesa structure serving as base for the mesa structure of the second pixel Pix2. This double mesa structure is illustrated in FIG. 11. Here, the layer AL1 is preferentially also of ISB type like the layer AL2. This double-mesa structure is compatible with a superposed arrangement of the meta-lenses of the meta-surface 13 guaranteeing the spatial coherence (illustrated in FIG. 11) and a staggered arrangement that is not illustrated.

According to one embodiment, a mesa structure of a second pixel in every two is used as pillar 15 so as to bring the first contact CL1 to substantially the same horizontal plane as the second contact CL2. The layer AL1 is divided into a subset of first mesas, but only one first mesa in every two 24 is used to produce an operational pixel Pix1. The second mesa 15 structuring the layer AL2 and disposed above this first mesa 24 then serves as pillar for the contact CL1, and is therefore not a detection pixel Pix2.

According to one option, an operational pixel Pix1 comprises a diffraction grating DG1 configured to diffract the first beam FL1 in reflection mode.

Nor is the first mesa disposed below an operational pixel Pix2 used for detection. The intermediate contact Cint between AL2 and AL1 is, for this double-mesa, linked to the common contact via the layer 18.

The contact CL1 of an operational pixel Pix1 extends from the summit of the mesa 15 to the still free summit of the first mesa serving as a base for it.

The detection diode of a pixel Pix1 is therefore produced between the common contact CC and CL1, whereas the detection diode of a pixel Pix2 is produced between the intermediate contact Cint linked to the common contact and CL2.

This double-mesa structure is compatible with a "diluted" arrangement of the pixels, and a "dense" arrangement, the latter being, however, difficult to produce. Indeed, in this case, a part of the surface of Pix2 must be lost to bring the contact Cint to the plane of CL2 at each pixel. This goes back to the difficulty of hybridization referred to in the state of the art.

The invention claimed is:

1. An optical detector (10) sensitive in at least two infrared wavelength ranges called first spectral band (SB1) and second spectral band (SB2), and having a set of pixels, comprising:
    an absorbent structure (Sabs) disposed on a bottom face (11) of a substrate (Sub) and comprising a stack of at least one absorbent layer (AL, AL1, AL2) made of semiconductor material, sensitive in the two spectral bands (SB1, SB2) and capable of photo-generating carriers by absorption of an incident beam (IL) on a top face (12) of said substrate,
    the absorbent structure being also linked to a read-out circuit by at least one set of contacts (CL1, CL2) associated with said pixels,
    the detector further comprises a plurality of dielectric resonators (Res) on the top face (12) of said substrate forming a top surface called meta-surface (13),
    the meta-surface being configured to diffuse, deflect and focus in the pixels of the detector in a resonant manner, when lit by the incident light (IL), a first beam (FL1) having at least one first wavelength ($\lambda 1$) lying within the first spectral band (SB1) and a second beam (FL2) having at least one second wavelength ($\lambda 2$) lying in the second band,
    the meta-surface being also configured so that said first (FL1) and second (FL2) beams are focused on different pixels of the detector.
2. The detector as claimed in claim 1, wherein the first spectral band (SB1) is contained within the 3-5 µm band (MWIR) and the second spectral band is contained within the 8-12 µm band (LWIR).

3. The detector as claimed in claim 1, wherein the stack comprises a single absorbent layer (AL) sensitive both in the first spectral band and the second spectral band, the first beam (FL1) being focused on a first subset of pixels called first pixels (Pix1), and the second beam (FL2) being focused on a second subset of pixels called second pixels (Pix2), said first and second pixels being disposed in the same plane.

4. The detector as claimed in claim 1, wherein said stack comprises a first absorbent layer (AL1) sensitive in the first spectral band (SB1) and disposed in a first plane (PL1), and a second absorbent layer (AL2) sensitive in the second spectral band (SB2) and disposed in a second plane (PL2) different from the first plane, the first absorbent layer being closest to the substrate, the first beam (FL1) being focused substantially in the first plane (PL1) on a first subset of pixels called first pixels (Pix1), and the second beam (FL2) being focused substantially in the second plane (PL2) on a second subset of pixels called second pixels (Pix2).

5. The detector as claimed in claim 4, wherein the second absorbent layer (AL2) is discontinuous and etched so that a second pixel (Pix2) has a mesa structure.

6. The detector as claimed in claim 5, wherein the second absorbent layer (AL2) produces an inter-subband detection (ISB).

7. The detector as claimed in claim 5, wherein a second pixel (Pix2) comprises a diffraction grating (DG2) configured to diffract the second beam (FL2) in reflection mode.

8. The detector as claimed in claim 4, wherein the first absorbent layer (AL1) is continuous.

9. The detector as claimed in claim 4, wherein the first absorbent layer (AL1) produces an inter-band detection.

10. The detector as claimed in claim 5, wherein each first pixel (Pix1) is linked to a first contact (CL1) and each second pixel (Pix2) is linked to a second contact (CL2), and wherein a mesa structure of a second pixel in every two is used as pillar (15) so as to bring the first contacts (CL1) to substantially a same horizontal plane as the second contacts (CL2).

11. The detector as claimed in claim 5, wherein each first pixel (Pix1) is linked to a first contact (CL1) and each second pixel (Pix2) is linked to a second contact (CL2), and wherein the first absorbent layer (AL1) is discontinuous and etched so that each first pixel (Pix1) has a mesa structure serving as base for the mesa structure of the second pixel (Pix2).

12. The detector as claimed in claim 11, wherein a mesa structure of a second pixel in every two is used as pillar (15) so as to bring the first contact (CL1) to substantially a same horizontal plane as the second contact (CL2).

13. The detector as claimed in claim 1, wherein a first meta-lens (ML1) is defined as the fraction of the meta-surface focusing the first beam in a first associated pixel, and a second meta-lens (ML2) is defined as the fraction of the meta-surface focusing the second beam in a second associated pixel, and wherein the meta-surface is configured so that the first and second meta-lenses are offset with respect to one another.

14. The detector as claimed in claim 1, wherein a first meta-lens (ML1) is defined as the fraction of the meta-surface focusing the first beam in a first associated pixel, and a second meta-lens (ML2) is defined as the fraction of the meta-surface focusing the second beam in a second associated pixel, and wherein the meta-surface is configured so that the first and second meta-lenses are superposed.

15. The detector as claimed in claim 13, wherein the sum of the respective surfaces of a first pixel and of a second pixel is less than or equal to the surface of a meta-lens.

* * * * *